United States Patent [19]

Fukushima

[11] Patent Number: 4,808,550
[45] Date of Patent: Feb. 28, 1989

[54] METHOD OF PRODUCING ISOLATION GROOVE STRUCTURE

[75] Inventor: Toshitaka Fukushima, Yokohama, Japan

[73] Assignee: Fujitsu Limited, Kawasaki, Japan

[21] Appl. No.: 217,072

[22] Filed: Jul. 8, 1988

Related U.S. Application Data

[62] Division of Ser. No. 908,209, Sep. 17, 1986, abandoned.

[30] Foreign Application Priority Data

Sep. 17, 1985 [JP] Japan .................... 60-208948

[51] Int. Cl.$^4$ .................... H01L 29/06; H01L 21/461
[52] U.S. Cl. ........................ 437/67; 437/68; 357/55
[58] Field of Search ............ 437/67, 68; 357/497, 357/54, 55

[56] References Cited

U.S. PATENT DOCUMENTS

| | | | |
|---|---|---|---|
| 4,269,636 | 5/1981 | Rivoli et al. | 156/648 |
| 4,397,075 | 8/1983 | Fatula et al. | 357/55 |
| 4,420,874 | 12/1983 | Tunatsu | 357/54 |
| 4,661,832 | 4/1987 | Lechaton et al. | 357/54 |

FOREIGN PATENT DOCUMENTS

| | | | |
|---|---|---|---|
| 53-33579 | 3/1978 | Japan | 437/67 |
| 58-168261 | 10/1983 | Japan | 437/67 |
| 58-169933 | 10/1983 | Japan | 437/68 |
| 58-28137 | 12/1983 | Japan | 437/67 |
| 59-4136 | 1/1984 | Japan | 437/67 |
| 59-43544 | 3/1984 | Japan | 437/67 |
| 60-57949 | 4/1985 | Japan | 437/67 |
| 0024262 | 2/1986 | Japan | 357/55 |
| 61-289642 | 12/1986 | Japan | 437/67 |

*Primary Examiner*—Olik Chaudhuri
*Attorney, Agent, or Firm*—Staas & Halsey

[57] ABSTRACT

An isolation groove structure comprises a deep isolation groove having a cross section with substantially straight and parallel side wall portions and a generally V-shaped bottom portion, and a shallow isolation groove having a generally V-shaped cross section. The V-shaped bottom portion of the deep isolation groove and the shallow isolation groove being formed simultaneously by anisotropic etching.

4 Claims, 6 Drawing Sheets

METHOD OF PRODUCING ISOLATION GROOVE STRUCTURE

This is a divisional of co-pending application Ser. No. 908,209, filed on Sept. 17, 1986, now abandoned.

BACKGROUND OF THE INVENTION

The present invention generally relates to isolation groove structures and methods for production thereof, and more particularly to isolation groove structures in which a deep isolation groove has a cross section with substantially straight and parallel side wall portions and a generally V-shaped bottom portion and a shallow isolation groove has a generally V-shaped cross section, and to a method for producing such isolation groove structures.

Techniques for isolating elements were developed when integrated circuits came into existence. At first, the junction isolation technique was used to isolate the elements, but with such technique the reduction of the element isolation region limited due to the lateral diffusion of the junction isolation. For this reason, the dielectric isolation technique was developed as the integration density of integrated circuit improved.

Dielectric isolation procedures such as the LOCOS process and the isoplanar isolation process are popularly used because with such procedures it is relatively easy to form oxide isolation layers. However, there is a problem in that the oxide layer obtained by the selectively oxidized isolation process are too wide. The isolation groove structure was developed to further improve the integration density of the integrated circuit.

The isolation grooves of the isolation groove structure may be classified as isolation grooves having a generally U-shaped cross section and isolation grooves having a generally V-shaped cross section. In the present specification, isolation grooves having a generally U-shaped cross section will be referred to as an U-grooves, and isolation grooves having a generally V-shaped cross section will be referred to as a V-grooves.

U-grooves are especially suited for the case where the isolation groove needs to be narrow and deep. However, when forming a U-groove, the are problems in that etching residue may remain at the bottom of the U-groove and the U-groove may not have a cross section with substantially straight and parallel side walls. Hence, when the U-groove is oxidized, the oxide layer is not uniformly formed at the portions of the U-groove where the shape irregularities exist. Furthermore, when a filling material such as polysilicon is subsequently introduced into the oxidized U-groove, the polysilicon does not completely fill the inside of the U-groove and portions thereof remain unfilled by the polysilicon. As a result, stresses are generated inside the U-groove. In other words, the generation of crystal defects is facilitated and cracks may be formed in the substrate in extreme cases, as will be described hereinbelow. In addition, when such things occur, it is difficult to control the depth of U-grooves.

On the other hand, it is easy to control the depth of the V-grooves. As will be described later in the specification, when the anisotropic etching characteristics of the 100-oriented silicon are used to form V-grooves, lack resultant V-groove is 0.7 times its width, However, it causes the V-groove. However, in the case where the isolation groove needs to be deep, there is a problem in that the width of the V-groove must consequently be wide. This does not improve the integration density of integrated circuits.

In order to further improve the integration density of integrated circuits, it is desirable to form narrow isolation grooves without generation of stresses as described above. Accordingly, there is need for isolation techniques in which the problems described above are eliminated.

SUMMARY OF THE INVENTION

It is a general object of the present invention to provide a novel and useful isolation groove structure and a method for production thereof, in which the problems described above are eliminated.

Another and more specific object of the present invention is to provide an isolation groove structure comprising a deep isolation groove which has a cross section with substantially straight and parallel side wall portions and a generally V-shaped bottom portion and a shallow isolation groovewhich has a generally V-shaped cross section. With the isolation groove structure of the present invention, it is possible to suppress the generation of stress inside the deep isolation groove when it is oxidized and filled with a filling material such as polysilicon. In addition, it is possible to accurately form the shallow isolation groove to a desired depth so that the shallow isolation groove reaches a buried layer of a substrate. It is thus possible to provide satisfactory isolation for a plurality of elements within a land region surrounded by the deep isolation groove and the buried layer of the substrate.

Still another object of the present invention is to provide a method of producing an isolation groove structure comprising the steps of forming a U-groove by reactive ion etching, and thereafter, by anisotropic etchings, simultaneously forming (1) a portion having a generally V-shaped cross section at the bottom of the U-groove so as to present a deep isolation groove having a cross section with substantially straight and parallel side wall portions and a generally V-shaped bottom portion and (2) a shallow isolation groove having a generally V-shaped cross section. According to the method of the present invention, it is possible to remove the etching residue and the like generated when the U-groove is formed, and it is possible also to suppress the generation of stress inside the deep isolation groove when the deep isolation groove is oxidized and filled with a filling material such as polysilicon. It is also possible at the same time to accurately form shallow isolation groove to a desired depth so that the shallow isolation groove reaches a buried layer of a substrate, simultaneously with the formation of the bottom portion of the deep isolation groove.

Other objects and further features of the present invention will be apparent from the following detailed description when read in conjunction with the accompanying drawings.

DETAILED DESCRIPTION

First, a conventional prior art method of forming a U-groove will be described with reference to FIGS. 1A through 1F.

Figure 1A:
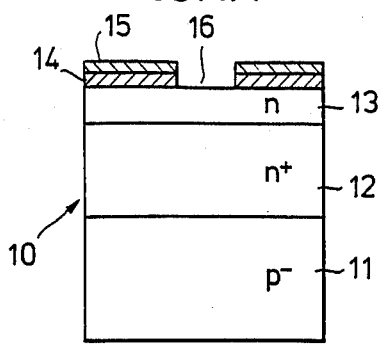
FIGS. 1A through 1F are cross sectional views for explaining the processes of forming U-grooves according to conventional prior art methodology.

In FIG. 1A, a substrate 10 comprises a $p^-$-type substrate base 11, an $n^+$-type buried layer 12, and an n-type epitaxial layer 13. A $SiO_2$ layer 14 and a $Si_3N_4$ layer 15 are formed on the epitaxial layer 13 of the substrate 10, and an element isolation region 16 is formed by a patterning process.

Figure 1B:
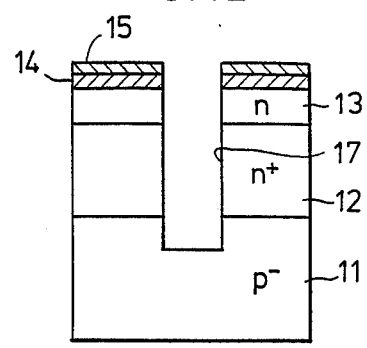

Next, an U-groove 17 is formed in the substrate 10 by reactive ion etching (RIE) using $CCl_4+O_2$ gas, as shown in FIG. 1B. The side walls of the groove 17 are substantially perpendicular to the substrate surface.

Figure 1C:
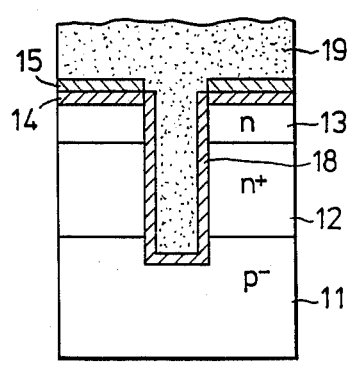

The inside of the U-groove 17 is oxidized and a $SiO_2$ layer 18 having a thickness of approximately 5000 Å is formed on the walls of the U-groove 17, as shown in FIG. 1C. Then, a polysilicon material 19 is filled into the U-groove 17 and deposited on top of the $SiO_2$ layer 18 and on the upper substrate surface.

Figure 1D:
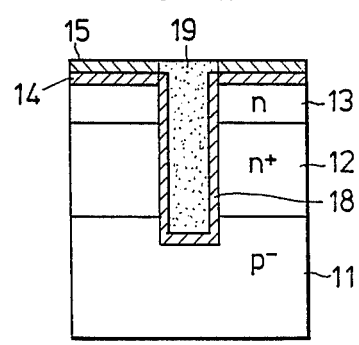
Figure 1E:
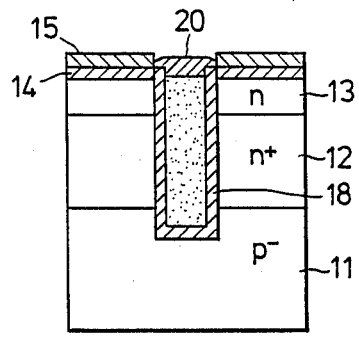
Figure 1F:
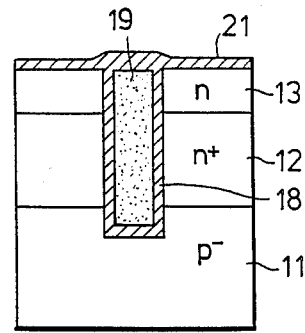

The polysilicon material 19 on the upper substrate surface is removed by a polishing process using the $Si_3N_4$ 15 as a stopper, as shown in FIG. 1D.

Next, a $SiO_2$ layer 20 having a thickness of 5000 Å to 8000 Å is formed on the upper surface of the polysilicon filler material 19 which fills the U-groove 17. During this operation the $Si_3N_4$ layer 15 is used as a mask, as sown in FIG. 1E.

Thereafter, the $Si_3N_4$ layer 15 and the $SiO_2$ layer 14 are washed out, and a $SiO_2$ layer 21 having a thickness of 1000 Å is newly formed atop the entire substrate surface, as shown in FIG. 4F.

However, the processes shown in FIGS. 1A through 1F show an ideal case, and the U-groove 17 may not have the ideal shape shown in these figures. In actual practice, the shape irregularities shown in FIGS. 2A through 2D occur.

Figure 2A:
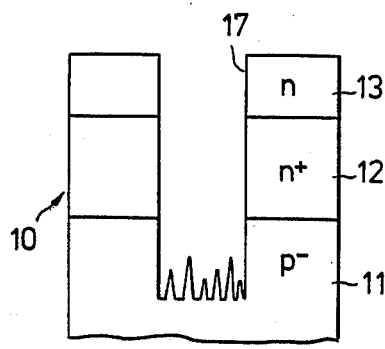
FIGS. 2A through 2D are cross sectional views for explaining the problems in the U-groove formed by the conventional prior art methodology.

FIG. 2A shows the case where the selective etching ratio is relatively large such that residue from the oxidation layer or the like remaining on the etching surface acts as a mask and leaves an etching residue. When viewed from above the U-groove 17, the etching residue looks black and the same is sometimes referred to as black silicon for this reason.

Figure 2B:
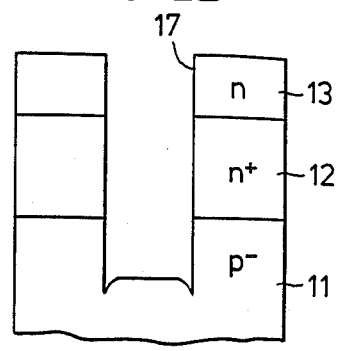

In order to form a U-groove 17 having an ideal shape, side etching should be prevented and the etching process must have anisotropy in the vertical direction to a certain extent. However, when the anisotropy in the vertical direction is too strong, a trenching phenomenon occurs at the bottom portion of the U-groove 17 as shown in FIG. 2B.

Figure 2C:
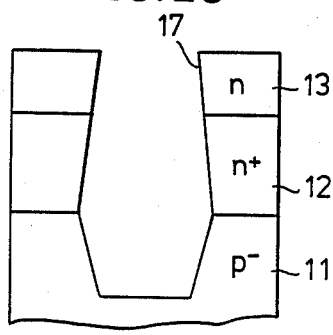

FIG. 2C shows the case where the reactive ions do not hit the etching surface perpendicularly but hit the etching surface at an angle depending on the etching conditions, thereby forming curved side walls. The cross section of the U-groove 17 in this case looks like a bottle.

Figure 2D:
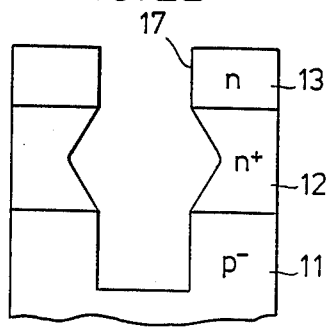

The etching rate differs depending on the different impurity densities of the substrate 10, and FIG. 2D shows the case where an under cut phenomeon has occured due to a faster etching rate of the buried layer 12.

As described heretofore, shape irregularities in the U-groove 17 cause generation of stress during the oxidation process in which the inside of the U-groove 17 is oxidized and the filling process in which the polysilicon material 19 is filled into the U-groove 17, and such iregularities accordingly cause crystal defects.

In addition to the above described problems, there is a problem in that it is difficult to control the depth of the U-groove 17 according to conventional methodology. When forming a plurality of elements within a land region surrounded by a deep U-groove and the buried layer in the integrated circuit, it is thus sometimes necessary to form shallow isolation grooves which stop at the upper portion of the buried layer, and the depth of the shallow U-grooves must be accurately controlled in such case. However, according to conventional methodology, it is difficult to accurately form such shallow U-grooves which stop at the buried layer.

The significance of isolation grooves having different depths is described in Japanese Patent Application Publication No. 55-28218, Japanese Laid-Open Patent Application No. 55-91164, Japanese Laid-Open Patent Application No. 55-93592 and Japanese Laid-Open Utility Model Application No. 55-34619 (or U.S. Pat. No. 4,420,411).

Next, a description will be given with respect to examples of previously proposed methods of producing the isolation groove structures and disadvantages thereof, by referring to FIGS. 3A through 5B. In FIGS. 3A through 5B, those parts which are the same as those corresponding parts in FIGS. 1A through 1F are designated by the same reference numerals, and description thereof will be omitted.

Figure 3A:
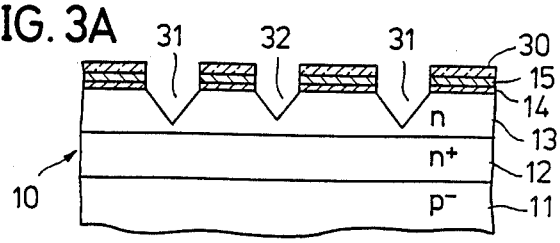
FIGS. 3A, 3B, 4A, 4B, 5A and 5B are cross sectional views for explaining examples of conventional isolation groove structures.
Figure 3B:
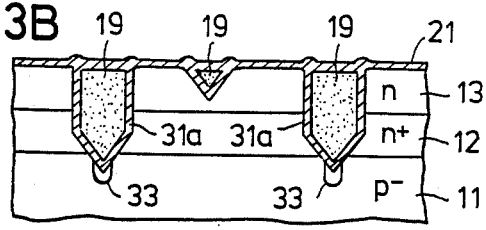

FIGS. 3A and 3B show the essential processes of producing isolation groove structure as proposed in Japanese Laid-Open Patent Application No. 58-168233, for example. In FIG. 3A, a phospho-silicate glass (PSG) layer 30 is formed on the $Si_3N_4$ layer 15, and V-grooves 31 and 32 are formed by a known anisotropic wet etching using KOH fluid, for example. Then a photoresist layer (not shown) is formed over the PSG layer 30, and windows (not shown) are formed at the V-grooves 31. RIE using $CCl_4+BCl_3$ gas, for example, is carried out through these windows so as to extend the V-grooves 31 down to the $p^-$-type substrate base 11 and obtain extended V-grooves 31a. The photoresist layer is removed and processes similar to those described before in conjunction with FIGS. 1C through 1F are carried out to obtain the isolation groove structure shown in FIG. 3B. In FIG. 3B, a $p^+$-type region 33 is formed at the bottom of each of the extended V-grooves 31a to function as a channel cut.

However, according to this first method, the bottom portion of the V-groove 31 is damaged when RIE is carried out to extend the V-groove 31. As a result, stresses are generated in the extended V-groove 31a when the extended V-groove 31a is oxidized and polysilicon filler 19 is filled into the extended V-groove 31a, due to the shape irregularities at the bottom of the extended V-groove 31a. In addition, there is a problem in that the photoresist layer is easily damaged when RIE is carried out to extend the V-groove 31. On the other hand, as shown in FIG. 3B, the V-groove 32 does not extend down to the buried layer 12 and thus does not provide an isolation groove for complete isolation for elements within a land region surrounded by the extended V-grooves 31a and the buried layer 12.

Figure 4A:
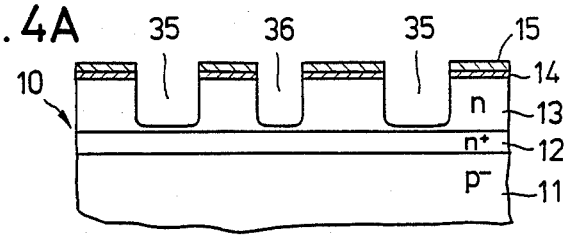
Figure 4B:
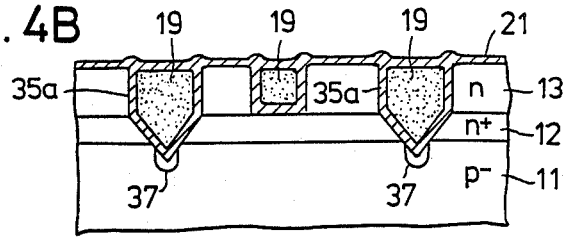

FIGS. 4A and 4B show the essential processes of producing the isolation groove structure proposed in a Japanese Laid-Open Patent Application No. 58-169933, for example. In FIG. 4A, U-grooves 35 and 36 are formed in the substrate 10 by processes similar to those described before in conjunction with FIGS. 1A through 1F. Then, the bottom portion of each of the U-grooves 35 is formed into a portion with a substantially V-shaped cross section by carrying out an anisotropic wet etching, so as to obtain extended V-grooves 35a which extend down to the p⁻-type substrate base 11. Thereafter, the extended V-grooves 35a and the U-groove 36 are oxidized and filled with the polysilicon filler 19 to obtain the isolation groove structure shown in FIG. 4B. In FIG. 4B, a p⁺-type region 37 is formed at the bottom of each of the extended V-grooves 35a to function as a channel cut.

However, according to this second method, the depth of the U-groove 36 cannot be controlled accurately. For this reason, it is difficult to form the U-groove 36 so that the U-groove 36 stops at the buried layer 12, and it is accordingly difficult to provide appropriate isolation for elements within a land region surrounded by the extended V-grooves 35a and the buried layer 12. Furthermore, there are the problems of shape irregularities at the bottom of the U-groove 36 and the stress generated thereby, for the reasons described before.

Figure 5A:
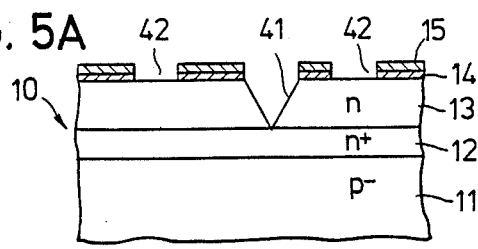
Figure 5B:
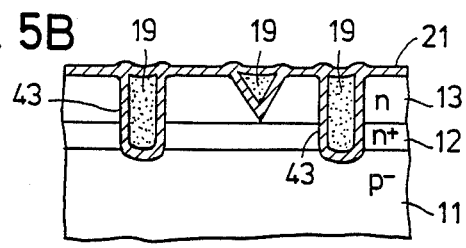

FIGS. 5A and 5B show the essential processes of producing the isolation groove structure proposed in a Japanese Laid-Open Patent Application No. 59-43544, for examle. In FIG. 5A, a V-groove 41 is first formed in the substrate 10 by an anisotropic wet etching, and windows 42 are formed. Then, U-grooves 43 are formed by RIE carried out through the windows 42, and the V-groove 41 and the U-grooves 43 are then oxidized and filled with the polysilicon material 19.

However, according to this third method, shape irregularities occur and as a result stress as described above is generated in the U-grooves 43. In extreme cases, the stress may cause cracks in the substrate 10.

Accordingly, the present invention provides an isolation groove structure and a method for production thereof in which the problems described heretofore are eliminated.

Next, with reference to FIGS. 6A through 6G, a description will be given with respect to an embodiment of the method of producing the isolation groove structure according to the present invention. In FIGS. 6A through 6G, those parts which are the same as those corresponding parts in FIGS. 1A through 1F will be designated by the same reference numerals, and description thereof will be omitted.

Figure 6A:
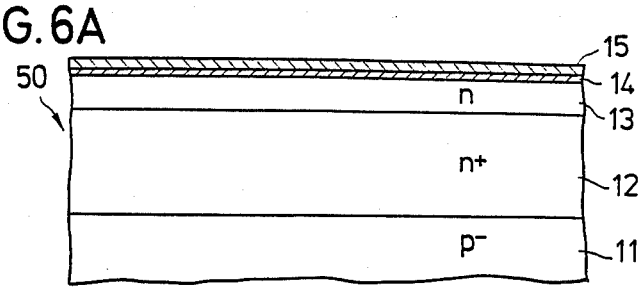
FIGS. 6A through 6G are cross sectional views for explaining an embodiment of the method of forming isolation groove structures according to the present invention.

As shown in FIG. 6A, a substrate 50 comprises the p⁻-type substrate base 11, the n⁺-type buried layer 12 having a thickness of 3 microns, for example, and the n-type epitaxial layer 13 having a thickness of 2 microns, for example. The SiO₂ layer 14 and the Si₃N₄ layer 15 are formed on the n-type epitaxial layer 13. For example, the SiO₂ layer 14 has a thickness of 1000 Å and the Si₃N₄ layer 15 has a thickness of 2000 Å.

Figure 6B:
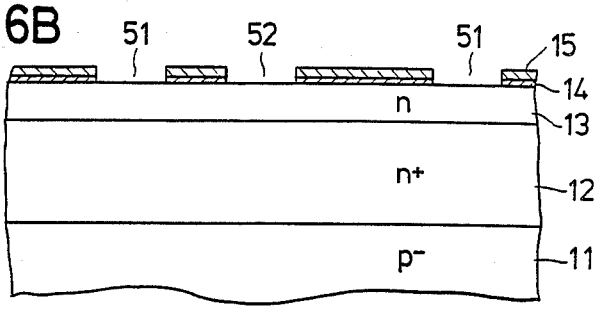

Next, windows 51 and 52 are formed by a patterning process using RIE or wet etching, as shown in FIG. 6B.

For example, the windows 51 and 52 have a width of 2 microns.

Figure 6C:
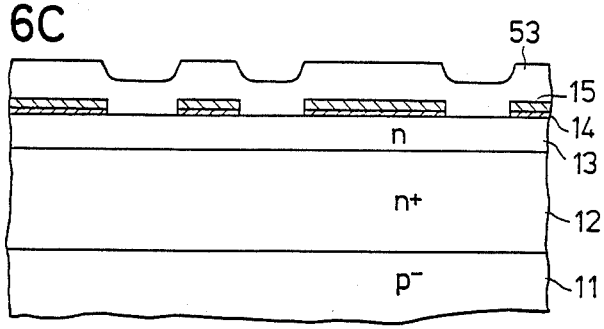

As shown in FIG. 6C, a PSG layer 53 is formed on the substrate surface by a chemical vapor deposition (CVD). For example, the PSG layer 53 has a thickness of 1 micron.

Figure 6D:
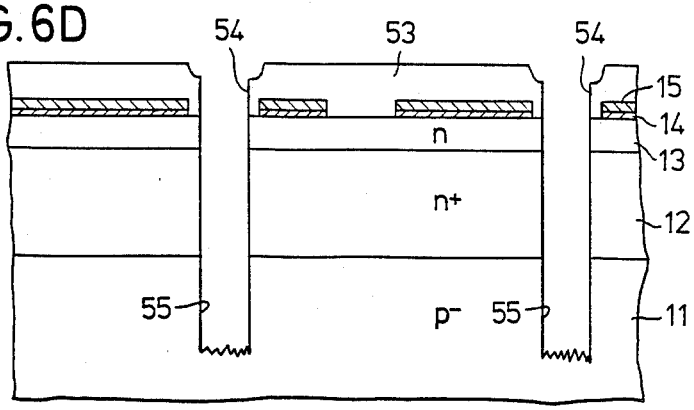

Then, as shown in FIG. 6D, a patterning process is carried out to form windows 54 in PSG layer 53 having a width of 1.4 microns, for example. PSG layer 53 is used as a mask and RIE is carried out by use of CCl₄+BCl₃ or CCl₄+O₂ gas so as to form U-grooves 55 having a depth of 8 microns, for example, so that the deep isolating grooves which are finally formed extend down to the p⁻-type substrate base 11.

Figure 6E:
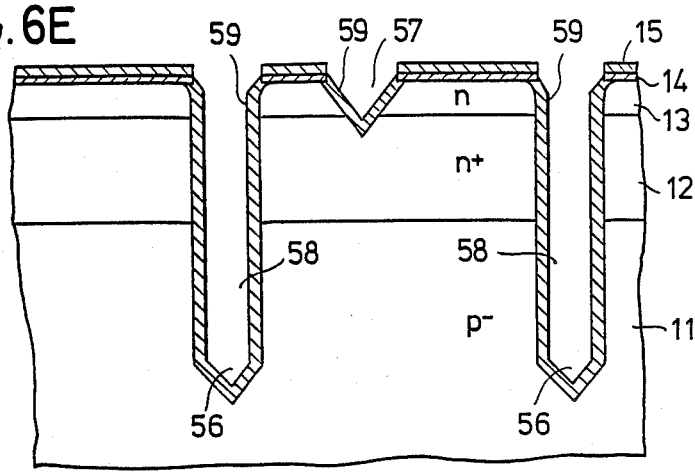

Next, as shown in FIG. 6E, the PSG layer 53 is removed, and an anisotropic wet etching is carried out to form V-grooves 56 and 57 by using the Si₃N₄ layer 15 as a mask. The anisotropic etching characteristics of 100-oriented silicon are used to form the V-grooves 56 and 57, and using an alkaline fluid such as KOH. When the width of a window through which anisotropic wet etching using 100-oriented silicon is carried out is denoted by W, it is known that the depth D of the V-groove which is formed can be described by the relationship $D=(\frac{1}{2}) \times W \times \tan(54.7°) \approx 0.7W$. Hence, it is possible to ensure that a shallow isolation groove finally formed at V-groove 57 stops at the n⁺-type buried layer 12 and does not extend beyond the n⁺-type buried layer 12. Thereafter, deep isolation grooves 58, each constituted by the U-groove portion and the V-groove portion, and the V-groove 57 are oxidized, and an SiO₂ oxide layer 59 is formed thereon. For example, the SiO₂ oxide layer 59 has a thickness of 3000 Å to 4000 Å.

Figure 6F:
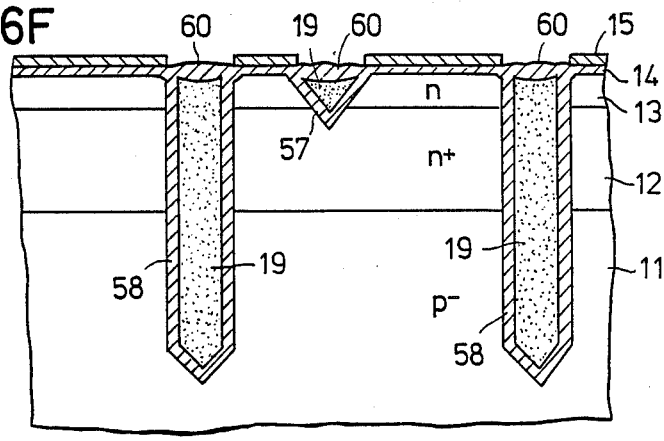

A non-doped polysilicon layer 19 is formed on the substrate surface to a thickness of 13 microns, for example, so that the polysilicon material fills the deep isolation grooves 58 and the V-groove 57. Then, the polysilicon layer 19 on top of the Si₃N₄ layer 15 is removed by chemical and mechanical polishing processes using the Si₃N₄ layer 15 as a stopper. As shown in FIG. 6F, the Si₃N₄ layer 15 is thereafter used as a mask for oxidizing the polysilicon 19 exposed at the openings of the deep isolation groove 58 and the V-groove 57. The oxide layer 60 formed at the openings of the deep isolation grooves 58 and the V-grooves 57 has a thickness of 5000 Å to 8000 Å, for example.

Figure 6G:
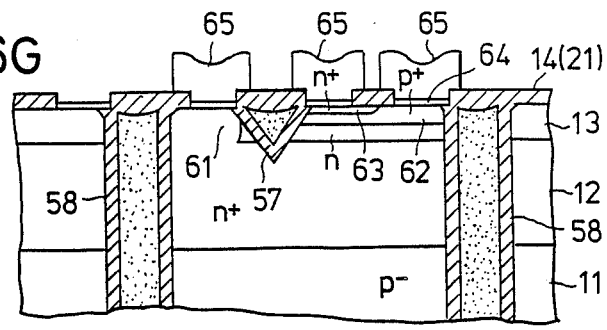
Figure 7A:
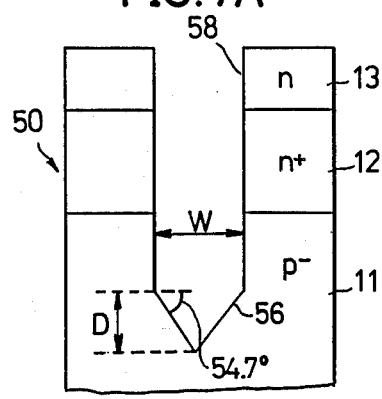
FIGS. 7A through 7D are cross sectional views for explaining the shape of deep isolation grooves formed according to the method of the present invention.
Figure 7B:
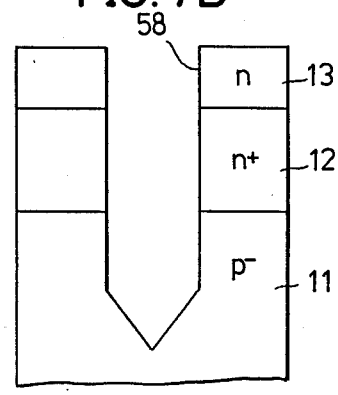
Figure 7C:
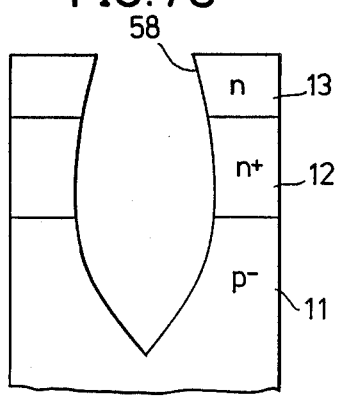
Figure 7D:
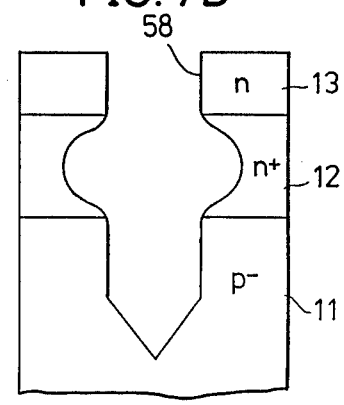

Finally, as shown in FIG. 6G, the Si₃N₄ layer 15 is washed out and elements are formed within a land region surrounded by the deep isolation grooves 58 and the n⁺-type buried layer 12. For example, an n⁺-type collector contact 61, a p⁺-type base region 62 having a thickness of 0.5 micron, an n⁺-type emitter region 63 having a thickness of 0.2 micron, a Ti layer 64 having a thickness of several tens of Å, and Al contact regions 65 having a thickness of 8000 Å are formed in the land region. The shallow V-groove 57 provides an isolation between the collector contact region 61 and the base and emitter regions 62 and 63. For example, the shallow V-groove 57 and the deep isolation groove 58 are used as a mask for masking the collector contact region 61.

As described before in conjunction with FIG. 1F, it is possible to wash out both the Si₃N₄ layer 15 and the SiO₂ layer 14 and thereafter form a new SiO₂ layer on the substrate surface. Furthermore, when forming a p⁺-type diffusion region below the V-groove portion of the deep isolation groove 58 as in the cases shown in FIGS. 3B and 4B, the isolation grooves may be oxidized in two stages. In this case, a first oxide layer of 1000 Å is formed, a photoresist layer is then formed and used as a mask to form the p+-type diffusion region, the photoresist layer is removed, and a second oxide layer of 2000 Å to 3000 Å is formed.

In addition, the V-groove formed by the anisotropic wet etching using the 100-oriented silicon may actually have a generally trapezoidal cross section depending on the stage when the etching is ended. Also, when the width of the shallow V-groove or the deep isolation groove is large, the groove may actually have a generally trapezoidal cross section rather than the generally V-shaped cross section.

FIGS. 7A through 7D are cross sectional views showing the shape of the deep isolation groove 58 formed according to the method of the present invention when anisotropic wet etching is carried out after the U-groove 55 is formed. As may be seen by comparing FIGS. 7A through 7D with the corresponding FIGS. 2A through 2D described before, the V-groove portion of the deep isolation groove 58 has smooth surfaces. Hence, the stress generated when the isolation groove is oxidized and filled with the polysilicon is effectively suppressed, and it is possible to prevent the crystal defects.

Figure 8:
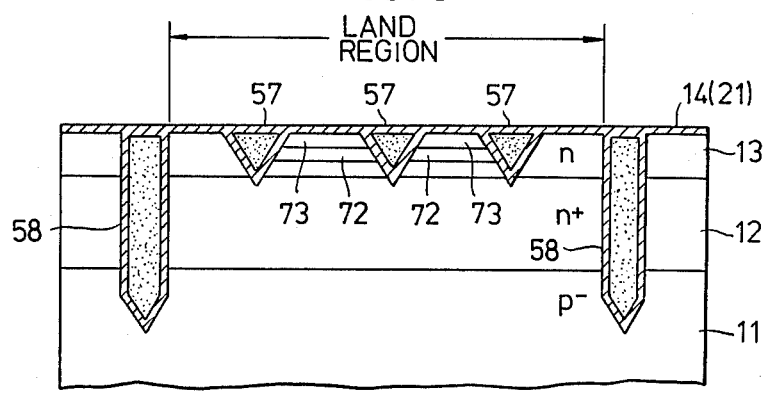
FIG. 8 is a cross sectional view showing an embodiment of an isolation groove structure of the present invention.

FIG. 8 shows an embodiment of the isolation groove structure according to the present invention. In FIG. 8, those parts which are the same as those corresponding parts in FIGS. 6A through 6G are designated by the same reference numerals, and description thereof will be omitted. In the present embodiment, a plurality of shallow V-grooves 57 are formed within the land region surrounded by the deep isolation grooves 58 and the n+-type buried layer 12. The shallow V-grooves 57 are formed simultaneously with the formation of the V-groove portions of the deep isolation grooves 58. Since the relationship $D \approx 0.7W$ described before stands, it is easy to form the shallow V-grooves 57 so that the shallow V-grooves 57 reach the upper portion of the n+-type buried layer 12.

In the embodiment of FIG. 8, p-type regions 72 and n-type regions 73 are formed in each region surrounded by the shallow V-grooves 57 so as to form NPN memory cells. A plurality of NPN memory cells are formed in the region surrounded by the deep isolation grooves 58 so as to form a memory cell array. The deep isolation grooves 58 isolate the n+-type buried layer 12 and the n-type epitaxial layer 13 so as to form an island of the memory cell array. The shallow V-grooves 57 are isolations for the memory cells. The reason for forming the shallow V-grooves 57 so as to reach the buried layer 12 is to avoid a parasitic PNPN SCR (silicon controlled rectifier) effect (or reverse blocking triode thyristor effect) which may be caused between the adjacent PNP memory cells.

Further, the present invention is not limited to these embodiments, but various variations and modifications may be made without departing from the scope of the present invention.

What is claimed is:

1. A method for producing an isolation groove structure comprising the steps of:

providing a semiconductor substrate comprising a substrate base having a first type of conductivity, a buried layer formed on said substrate base and having a second type of conductivity that is opposite to that of said first type of conductivity and an epitaxial layer formed on said buried layer and having said second type of conductivity and an impurity concentration that is lower than that of said buried layer;

forming in said semiconductor substrate by reactive ion etching, a first groove portion having a generally U-shaped cross section and wide walls which are substantially straight and parallel to each other;

simultaneously forming in said semiconductor substrate by anisotropic etching, second and third groove portions having generally V-shaped cross sections, said second groove portion being formed at the bottom of said first groove portion, thereby presenting a deep isolation groove extending to said substrate base, said third groove portion being formed at a location different from that of said first groove portion and presenting a shallow isolation groove not reaching said substrate base; and oxidizing said deep isolation groove and said shallow isolation groove, so that elements on said semiconductor substrate are isolated thereby.

2. A method of producing an isolation groove structure as set forth in claim 1 wherein, during said step of simultaneously forming said second and third groove portions, the third groove portion is formed to extend to such a depth that said shallow isolation groove extends only to an upper portion of said buried layer.

3. A method of producing an isolation groove structure as set forth in claim 1 wherein, during said step of forming said first groove portion, the latter is formed to such a depth that it extends to said substrate base.

4. A method of producing an isolation groove structure as set forth in claim 1 wherein said deep isolation groove and said buried layer are disposed to surround a land region, said step of simultaneously forming said second and third groove portions including forming said third groove portion at a location within said land region.

* * * * *

UNITED STATES PATENT AND TRADEMARK OFFICE
CERTIFICATE OF CORRECTION

PATENT NO. : 4,808,550
DATED : February 28, 1989
INVENTOR(S) : TOSHITAKA FUKUSHIMA It is certified that error appears in the above-identified patent and that said Letters Patent is hereby corrected as shown below:

FRONT PAGE

[30] Japan priority "60-208948" should be --60-205948--.

[56] References Cited (Foreign Patent Documents) "58-28137" should be --58-206137--.

[57] Abstract, line 1, begin new paragraph with "An".

Column 1, line 39, delete "an";
         line 41, delete "a";
         line 62, delete the first occurrence of "the";
         line 64, delete "the".

Column 2, line 6, after "is" insert --a--;
         line 64, "U-groove" should be --U-grooves--.

Signed and Sealed this

Third Day of October, 1989

Attest:

DONALD J. QUIGG

Attesting Officer      Commissioner of Patents and Trademarks